United States Patent
Higashi et al.

(10) Patent No.: US 10,685,858 B2
(45) Date of Patent: Jun. 16, 2020

(54) SUBSTRATE PROCESSING METHOD AND SUBSTRATE PROCESSING APPARATUS

(71) Applicant: Tokyo Electron Limited, Tokyo (JP)

(72) Inventors: Hiroyuki Higashi, Kumamoto (JP);
Takahisa Otsuka, Kumamoto (JP);
Kazuyoshi Shinohara, Kumamoto (JP);
Takashi Nakazawa, Kumamoto (JP);
Seiya Fujimoto, Kumamoto (JP);
Yuichi Douki, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/019,773

(22) Filed: Jun. 27, 2018

(65) Prior Publication Data
US 2019/0006206 A1 Jan. 3, 2019

(30) Foreign Application Priority Data
Jul. 3, 2017 (JP) .................. 2017-130027

(51) Int. Cl.
*H01L 21/67* (2006.01)
*H01L 21/3065* (2006.01)
*H01L 21/306* (2006.01)

(52) U.S. Cl.
CPC .... *H01L 21/67069* (2013.01); *H01L 21/3065* (2013.01); *H01L 21/30608* (2013.01); *H01L 21/6708* (2013.01); *H01L 21/67017* (2013.01); *H01L 21/67028* (2013.01)

(58) Field of Classification Search
None
See application file for complete search history.

(56) References Cited

U.S. PATENT DOCUMENTS

| 4,176,206 | A | * | 11/1979 | Inoue | H01L 21/31654 438/767 |
| 6,082,373 | A | * | 7/2000 | Sakurai | B08B 3/12 134/1 |
| 10,186,435 | B2 | * | 1/2019 | Miura | B01F 1/0038 |
| 2003/0068579 | A1 | * | 4/2003 | Takahashi | G03F 7/3021 430/311 |
| 2008/0179280 | A1 | * | 7/2008 | McGlashan-Powell | C09K 13/04 216/37 |
| 2009/0023231 | A1 | * | 1/2009 | Ohmi | H01L 21/02052 438/16 |
| 2011/0030722 | A1 | * | 2/2011 | Ida | C11D 3/02 134/1 |
| 2011/0042281 | A1 | * | 2/2011 | Tokoshima | C02F 1/68 210/96.1 |

(Continued)

FOREIGN PATENT DOCUMENTS

JP 09-246254 A 9/1997

*Primary Examiner* — Allan W. Olsen
(74) *Attorney, Agent, or Firm* — Abelman, Frayne & Schwab

(57) ABSTRACT

The substrate processing method according to an exemplary embodiment includes a low temperature dissolving processing and an etching processing. The low temperature dissolving processing dissolves oxygen in an alkaline aqueous solution cooled to a predetermined temperature lower than the room temperature. The etching processing etches a substrate by supplying the alkaline aqueous solution in which oxygen is dissolved to the substrate.

8 Claims, 9 Drawing Sheets

(56) References Cited

U.S. PATENT DOCUMENTS

| | | | | |
|---|---|---|---|---|
| 2011/0104840 A1* | 5/2011 | Burdinski | .............. | B82Y 10/00 |
| | | | | 438/34 |
| 2011/0212185 A1* | 9/2011 | Tanaka | .................... | A01G 7/00 |
| | | | | 424/600 |
| 2013/0306238 A1* | 11/2013 | Miura | ................... | B01F 1/0038 |
| | | | | 156/345.11 |
| 2014/0080312 A1* | 3/2014 | Iwamoto | ........... | H01L 21/30608 |
| | | | | 438/748 |
| 2014/0245962 A1* | 9/2014 | Watsuji | ................ | A01K 63/042 |
| | | | | 119/263 |
| 2016/0296894 A1* | 10/2016 | Brahmbhatt | ............... | A23L 2/54 |
| 2018/0182666 A1* | 6/2018 | Uzoh | ................... | B81B 7/0006 |

* cited by examiner

SUBSTRATE PROCESSING METHOD AND SUBSTRATE PROCESSING APPARATUS

CROSS-REFERENCE TO RELATED APPLICATIONS

This application is based on and claims priority from Japanese Patent Application No. 2017-130027 filed on Jul. 3, 2017 with the Japan Patent Office, the disclosure of which is incorporated herein in its entirety by reference.

TECHNICAL FIELD

Exemplary embodiments disclosed herein relate to a substrate processing method and a substrate processing apparatus.

BACKGROUND

In the related art, a substrate processing method for etching a polysilicon layer on a substrate by supplying an alkaline aqueous solution to a substrate such as a semiconductor wafer (hereinafter, referred to as a "wafer") is known in a semiconductor manufacturing process (see, e.g., Japanese Laid-open Patent Publication No. 09-246254).

SUMMARY

The substrate processing method according to an aspect of an exemplary embodiment includes a low temperature dissolving processing and an etching processing. The low temperature dissolving processing dissolves oxygen in an alkaline aqueous solution cooled to a predetermined temperature lower than the room temperature. The etching processing etches a substrate by supplying the alkaline aqueous solution in which oxygen is dissolved to the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
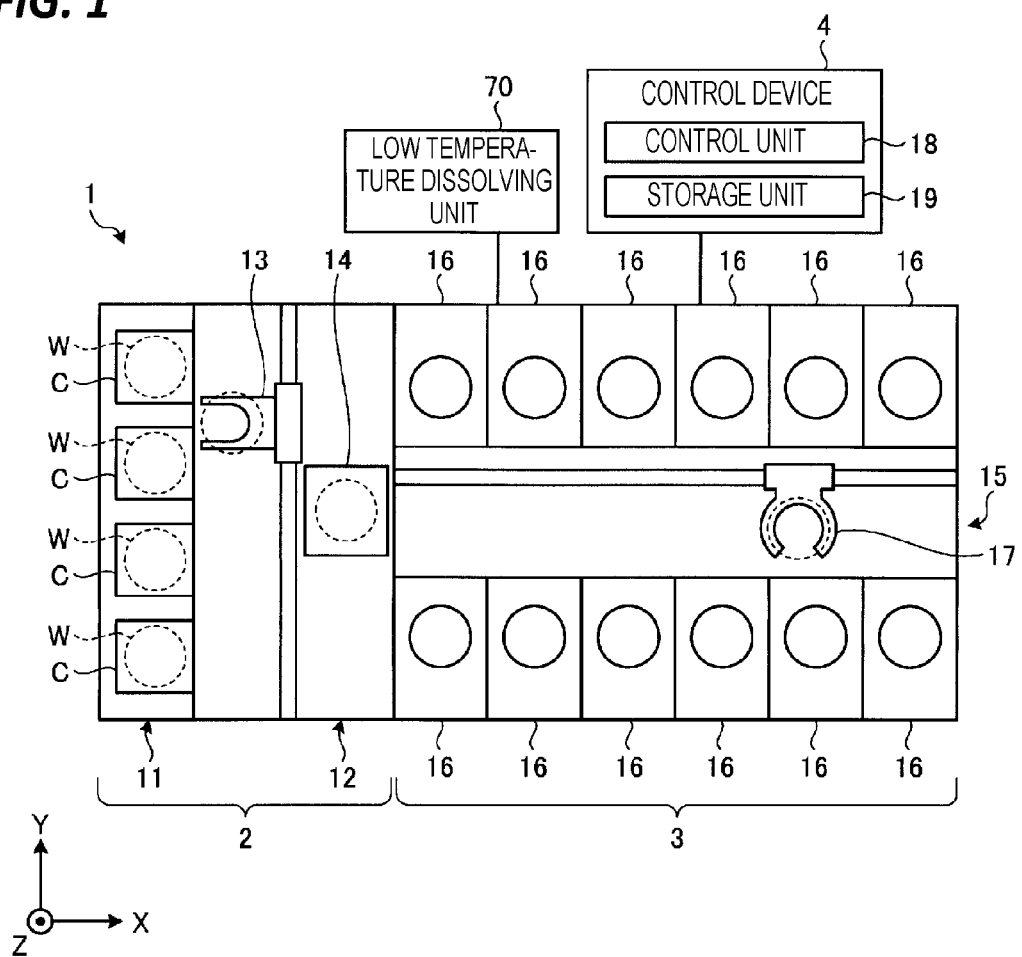
FIG. 1 is a schematic view illustrating an outline of a substrate processing system according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In a substrate processing method in the related art, there is a problem in that an in-plane uniformity of an etching amount from the center portion of a wafer to the peripheral portion thereof is not sufficient.

An aspect of an exemplary embodiment is made in view of the problem described above, and the present disclosure is to provide a substrate processing method and a substrate processing apparatus capable of improving the in-plane uniformity of the etching amount from the center portion of the wafer to the peripheral portion thereof.

The substrate processing method according to an aspect of an exemplary embodiment includes a low temperature dissolving processing and an etching processing. The low temperature dissolving processing dissolves oxygen in an alkaline aqueous solution cooled to a predetermined temperature lower than the room temperature. The etching processing etches a substrate by supplying the alkaline aqueous solution in which oxygen is dissolved to the substrate to etch the substrate.

In the above described substrate processing method, the alkaline aqueous solution contains at least one of tetramethylammonium hydroxide (TMAH), choline aqueous solution, potassium hydroxide (KOH) aqueous solution, and aqueous ammonia.

The above described substrate processing method further includes, before the etching processing, an oxide film removing processing of removing a natural oxide film formed on a surface of the substrate.

In the above described substrate processing method, the etching processing is performed within a preset time after the oxygen film removing processing.

The above described substrate processing method further includes, after the low temperature dissolving processing, and before or simultaneously with the etching processing, a temperature raising processing of raising a temperature of the alkaline aqueous solution.

In the above described substrate processing method, the temperature raising processing includes at least one of a processing of raising a temperature of a supply line configured to supply the alkaline aqueous solution to the substrate and a processing of raising a temperature of the substrate to which the alkaline aqueous solution is supplied.

In the above described substrate processing method, the low temperature dissolving processing dissolves oxygen such that the dissolved oxygen in the alkaline aqueous solution is saturated.

In the above described substrate processing method, the etching processing is performed under an atmosphere which contains oxygen.

A substrate processing apparatus according to an aspect of an exemplary embodiment is provided with a low temperature dissolving unit configured to dissolve oxygen in an alkaline aqueous solution cooled to a predetermined temperature lower than the room temperature and a supply unit configured to supply the alkaline aqueous solution in which oxygen is dissolved to a substrate. The substrate is etched by supplying the alkaline aqueous solution from the supply unit to the substrate.

In the above described substrate processing apparatus further includes a heater provided in a supply line of the alkaline aqueous solution which is provided between the low temperature dissolving unit and the supply unit.

According to an aspect of an exemplary embodiment, it is possible to improve an in-plane uniformity of an etching amount from the center portion of a wafer to the peripheral portion thereof.

<Overview of Substrate Processing System>

First, an outline of a substrate processing system 1 according to an exemplary embodiment of the present disclosure will be described with reference to FIG. 1. FIG. 1 is a plan view illustrating an outline of a substrate processing system 1 provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of substrates, that is, semiconductor wafers W in the present exemplary embodiment (hereinafter, referred to as "wafers") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17. The processing units 16 is connected to a low temperature dissolving unit 70 configured to dissolve oxygen in an alkaline aqueous solution L cooled to a predetermined temperature lower than the room temperature and supply to the processing units 16. An example of configuration of the processing units 16 and the low temperature dissolving unit 70 will be described later.

Further, the liquid processing system 1 is provided with a control device 4. The control device 4 is, for example, a computer, and includes a control unit 18 and a storage unit 19. The storage unit 19 stores a program that controls various processings performed in the liquid processing system 1. The control unit 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

<Overview of Processing Unit and Low Temperature Dissolving Unit>

Figure 2:
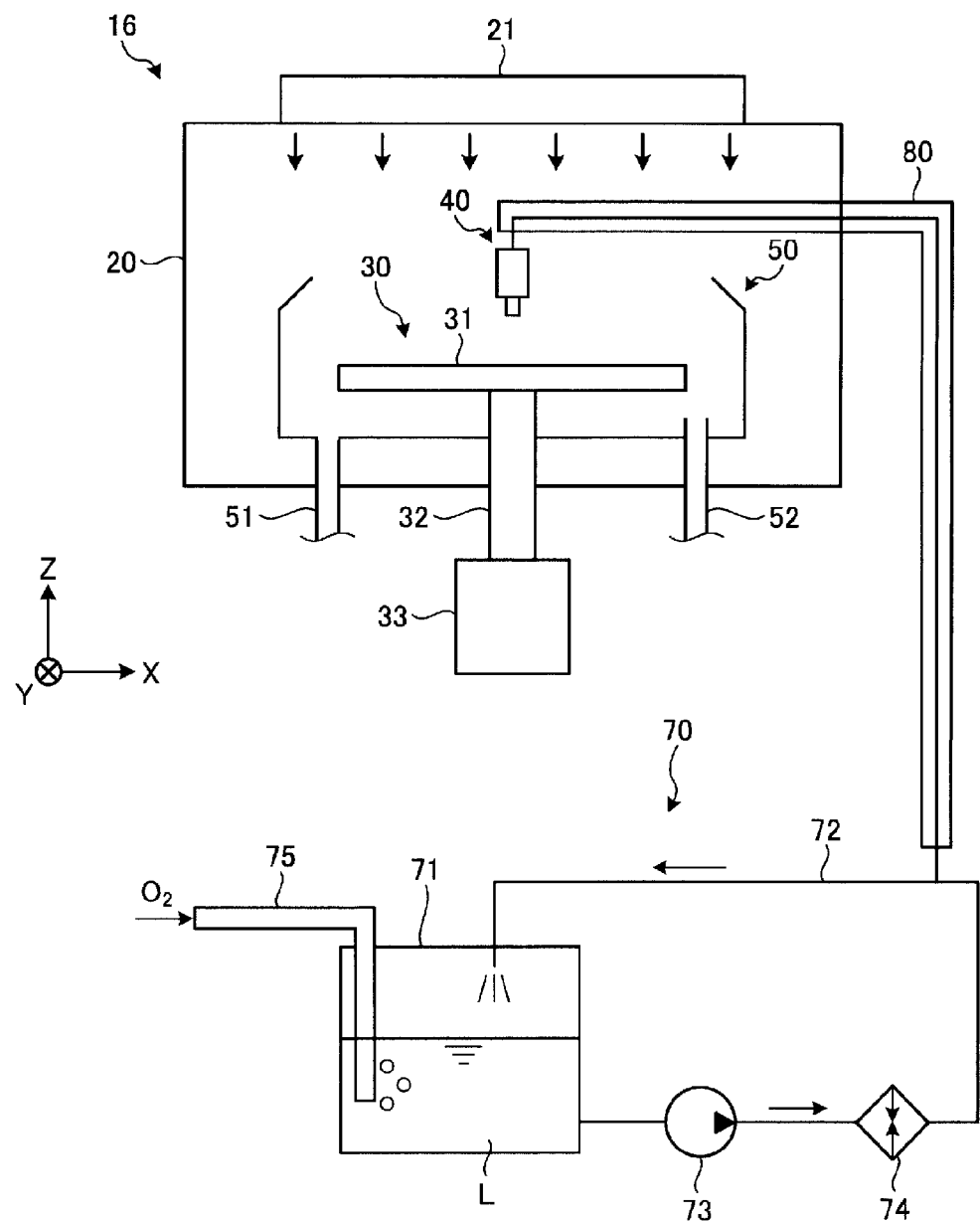
FIG. 2 is a schematic view illustrating a configuration of a processing unit and a low temperature dissolving unit.

Next, an overview of the processing unit 16 and the low temperature dissolving unit 70 will be described with reference to FIG. 2. FIG. 2 is a schematic view illustrating a configuration of the processing unit 16 and the low temperature dissolving unit 70. As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow within the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis.

The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 is an example of a supply unit and supplies a processing fluid onto the wafer W.

Further, the processing fluid supply unit 40 is connected to the low temperature dissolving unit 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside of the processing unit 16.

The low temperature dissolving unit 70 includes a chemical liquid storage container 71, a circulation line 72, a pump 73, a temperature regulator 74, and a bubbling line 75.

In the chemical liquid storage container 71, an alkaline aqueous solution L used as an etching liquid is stored. The alkaline aqueous solution L contains, for example, at least one of tetramethylammonium hydroxide (TMAH), choline aqueous solution, potassium hydroxide (KOH) aqueous solution, and aqueous ammonia.

The circulation line 72 configured to circulate the stored alkaline aqueous solution L is connected to the chemical liquid storage container 71. The circulation line 72 is connected to the fluid supply unit 40 described above.

The circulation line is provided with the pump 73 and the temperature regulator 74. The alkaline aqueous solution L cooled to a predetermined temperature lower than the room temperature by the temperature regulator 74 is circulated through the circulation line 72 by the pump 73. Further, the bubbling line 75 configured to dissolve oxygen in the stored alkaline aqueous solution L by bubbling oxygen gas is provided in the chemical liquid storage container 71.

By the low temperature dissolving unit 70 described so far, a low temperature dissolving processing is performed to dissolve oxygen in the alkaline aqueous solution L cooled to a predetermined temperature lower than the room temperature. Further, in the supply line for the alkaline aqueous solution L connected from the low temperature dissolving unit 70 to the processing fluid supply unit 40, an in-line heater 80 configured to raise the temperature of the alkaline aqueous solution L passing through the supply line is provided.

Figure 3:
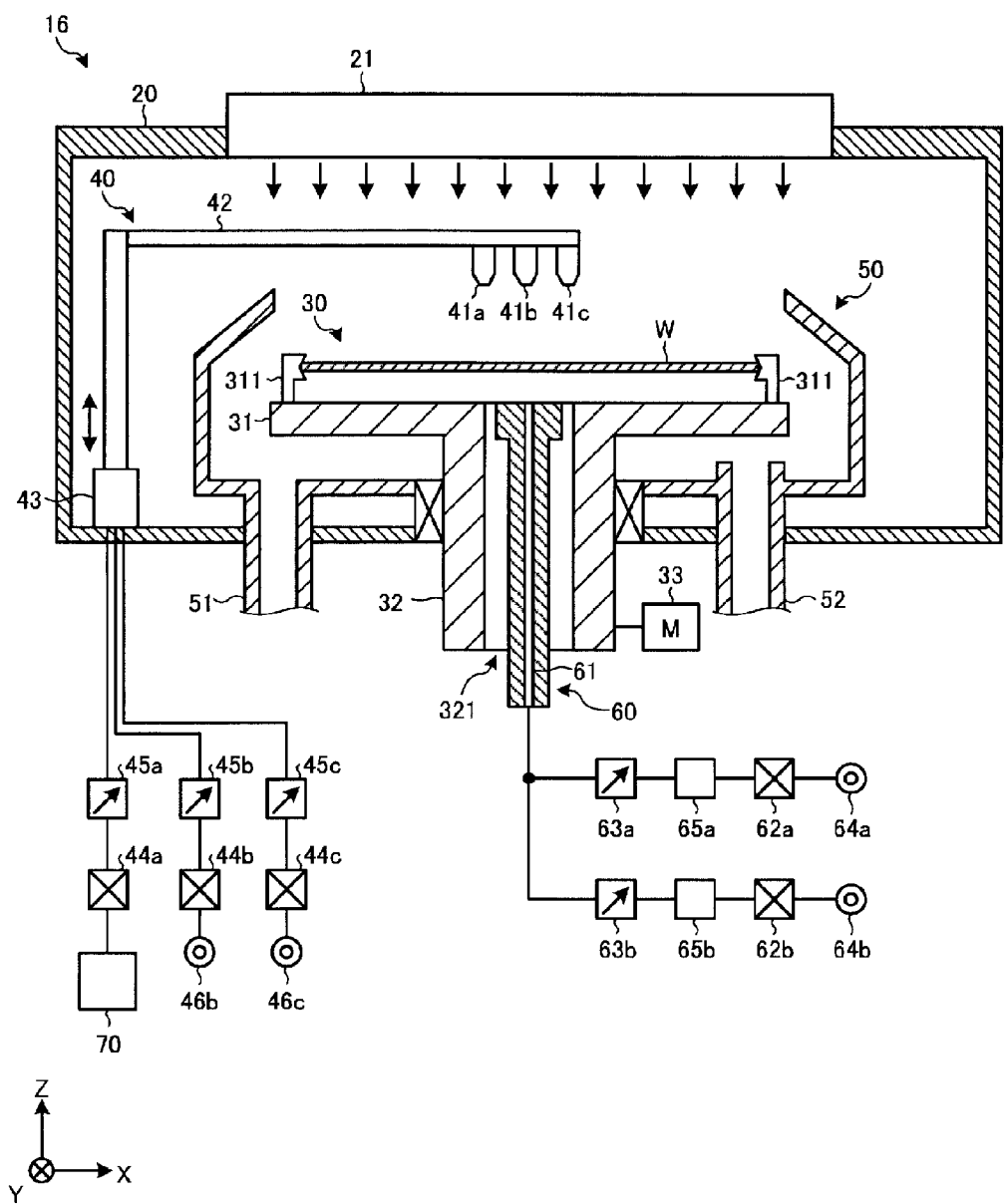
FIG. 3 is a schematic view illustrating an example of a specific configuration of a processing unit.

Next, a specific configuration example of the processing unit 16 will be described with reference to FIG. 3. FIG. 3 is a schematic view illustrating a specific configuration example of the processing unit 16. Further, the description of the in-line heater 80 is omitted in FIG. 3.

As illustrated in FIG. 3, a holding member 311 configured to hold the wafer W from the lateral side is provided on the upper surface of the holding unit 31 provided in the substrate holding mechanism 30. The wafer W is held horizontally in a state of being slightly spaced apart from the upper surface of the holding unit 31 by the holding member 311. Further, the wafer W is held by the holding unit 31 in a state where the surface to which the etching processing is performed faces upward.

The processing fluid supply unit 40 includes a plurality of (here, three) nozzles 41a, 41b, and 41c, an arm 42 that horizontally supports the nozzles 41a, 41b, and 41c, and a pivoting and lifting mechanism 43 that pivots and lifts the arm 42.

The nozzle 41a is connected to the above described low temperature dissolving unit 70 via a valve 44a and a flow rate regulator 45a. The nozzle 41b is connected to a DIW supply source 46b through a valve 44b and a flow rate regulator 45b. Deionized water (DIW) is used for a rinse processing, for example. The nozzle 41c is connected to a DHF supply source 46c through a valve 44c and a flow rate regulator 45c. Diluted hydrofluoric acid (DHF) aqueous solution is used for an oxygen film removing processing, for example.

From the nozzle 41a, the alkaline aqueous solution L supplied from the low temperature dissolving unit 70 is ejected. From the nozzle 41b, the DIW supplied from the DIW supply source 46c is ejected. From the nozzle 41c, the DHF supplied from the DHF supply source 46c is ejected. Further, by operating the in-line heater 80 illustrated in FIG. 2, the alkaline aqueous solution L is able to be heated and discharged.

The processing unit 16 further includes a lower surface supply unit 60. The lower supply unit 60 is inserted through a hollow section of the holding unit 31 and the support unit 32. A flow path 61 extending in the vertical direction is formed inside the lower surface supply unit 60. The DIW supply source 64a is connected to the flow path 61 via a flow rate regulator 63a, a heating unit 65a, and a valve 62a. Further, a TMAH supply source 64b is connected to the flow path 61 via a flow rate regulator 64b, a heating unit 65b, and a valve 62b.

The DIW supplied from the DIW supply source 64a is heated to a temperature higher than the room temperature by the heating unit 65a and supplied to the flow path 61. The TMAH supplied from the TMAH supply source 64a is heated to a temperature higher than the room temperature by the heating unit 65b and supplied to the flow path 61.

By using the processing unit 16 described so far, the etching processing of the wafer W with the alkaline aqueous solution L is performed. Here, the etching processing according to the exemplary embodiment is performed by supplying the alkaline aqueous solution L which is cooled to a predetermined temperature lower than the room temperature in the low temperature dissolving unit 70 and in which oxygen is dissolved in the cooled state to the wafer W.

Figure 4:
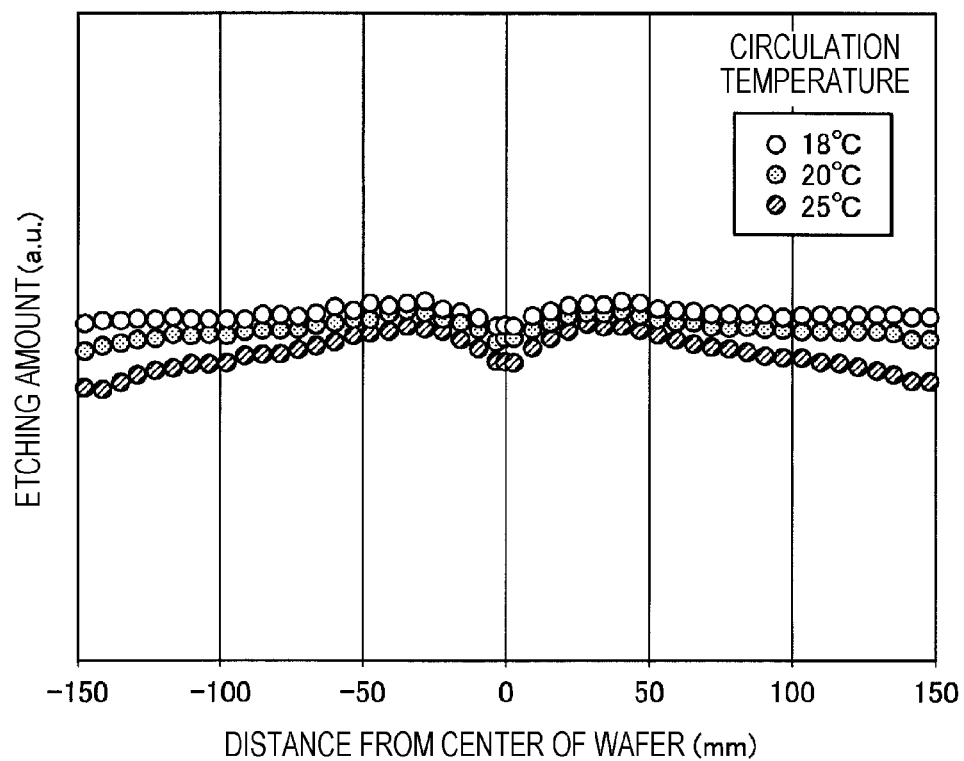
FIG. 4 is a diagram illustrating a relationship between an oxygen dissolving temperature of an alkaline aqueous solution and an in-plane distribution of an etching amount.

FIG. 4 is a diagram illustrating a relationship between an oxygen dissolving temperature of an alkaline aqueous solution L and an in-plane distribution of an etching amount, and illustrates results of measuring the etching amount on the surface of the wafer W in the radial direction after the etching processing. Further, FIG. 4 illustrates results when TMAH is used as the alkaline aqueous solution L, and illustrates an etching amount when the nozzle 41a is fixed above the center of the wafer W and the alkaline aqueous solution L is ejected from the nozzle 41a.

As illustrated in FIG. 4, as compared with a case of using an alkaline aqueous solution L which is oxygen dissolving processed at room temperature (25° C.), the in-plane uniformity of the etching amount from the center portion of the wafer W to the peripheral portion thereof may be improved by using an alkaline aqueous solution L which is oxygen dissolving processed at 20° C. and 18° C. which are lower than the room temperature. Particularly, the in-plane uniformity of the etching amount may be further improved in a case of using the alkaline aqueous solution L which is oxygen dissolving processed at 18° C. which is a lower temperature.

Figure 5:
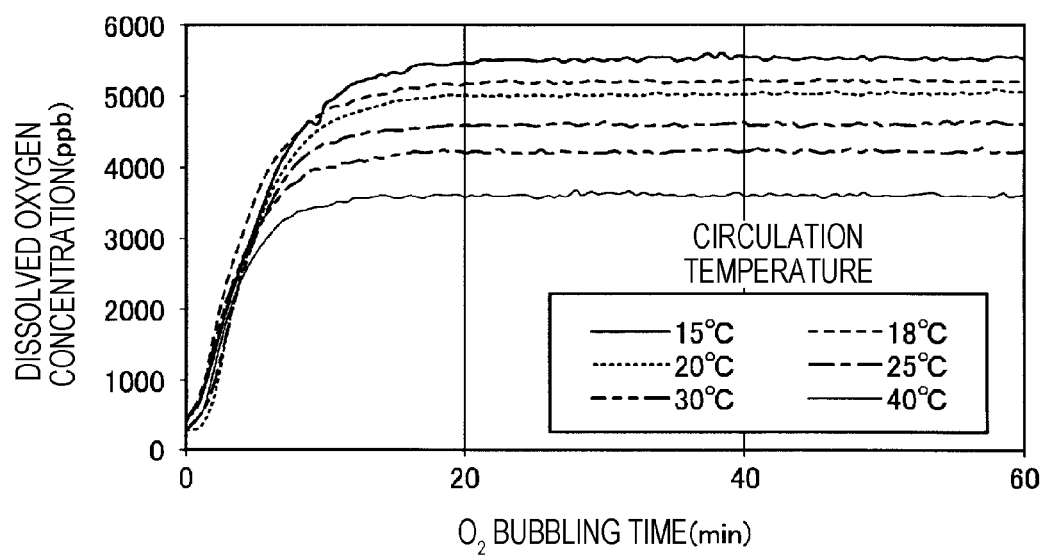
FIG. 5 is a diagram illustrating a relationship between a bubbling time of oxygen gas and dissolved oxygen concentration in an alkaline aqueous solution.

Next, the reason why the results illustrated in FIG. 4 are obtained will be explained with reference to FIGS. 5 to 7. FIG. 5 is a diagram illustrating a relationship between a bubbling time of oxygen gas and dissolved oxygen concentration in an alkaline aqueous solution L, and illustrates results when TMAH is used as the alkaline aqueous solution L.

As illustrated in FIG. 5, when oxygen gas is bubbled for about 15 to 20 minutes at any circulation temperature, the dissolved oxygen in the alkaline aqueous solution L becomes saturated. In the saturated state of dissolved oxygen, when the circulation temperature is lower than the room temperature (25° C.), the dissolved oxygen concentration may be increased as compared with a case where the circulation temperature is the room temperature or higher.

Figure 6:
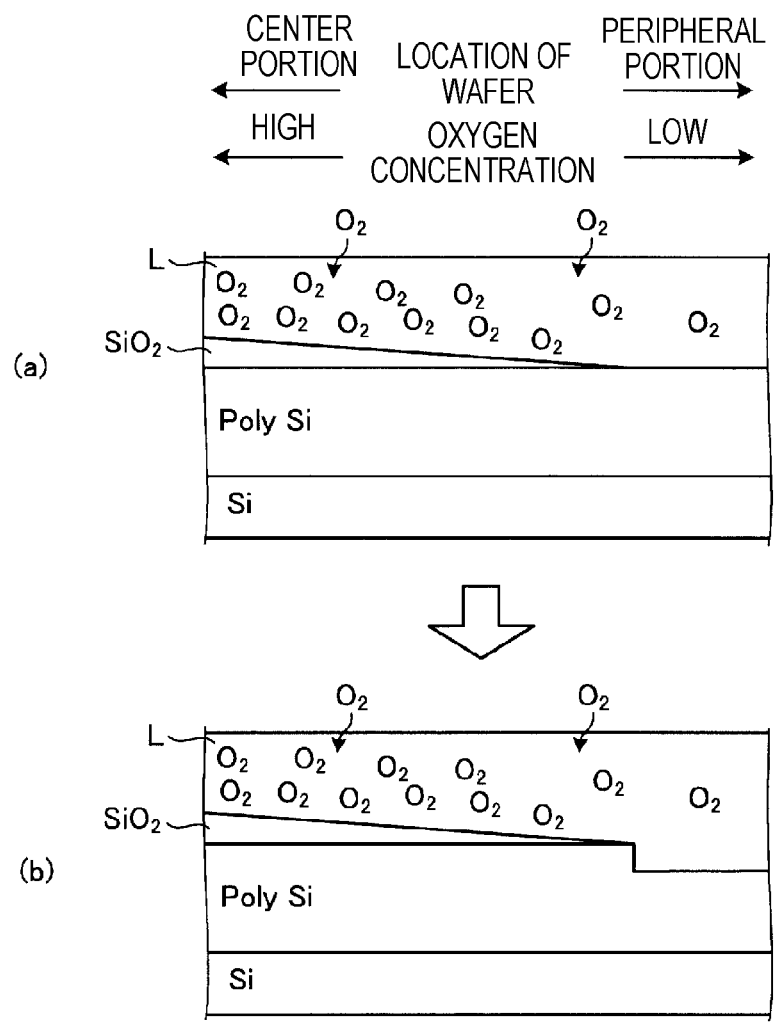
FIG. 6 is a diagram for explaining a surface state of a wafer in a reference example 1.

FIG. 6 is a diagram for explaining a surface state of a wafer W in a reference example 1. FIG. 6 is a diagram illustrating, for example, a case where the circulation temperature is the room temperature or higher and the amount of dissolved oxygen in the alkaline aqueous solution L is not sufficient. As described above, when the alkaline aqueous solution L is ejected toward the center portion of the wafer W, the oxygen concentration in the alkaline aqueous solution L at the center portion of the wafer W is relatively high.

On the one hand, when the alkaline aqueous solution L spreads toward the peripheral portion of the wafer W, oxygen in the solution reacts with the polysilicon layer on the surface of the wafer W so as to form a $SiO_2$ film, and the oxygen concentration gradually lowers. Here, in a reference example 1, since the amount of dissolved oxygen in the alkaline aqueous solution L is not sufficient, as illustrated in (a) in FIG. 6, the oxygen in the solution is substantially depleted at least on the peripheral portion of the wafer W. As a result, a $SiO_2$ film is not formed on the surface of the polysilicon layer on the peripheral portion of the wafer W, and the polysilicon layer is being exposed.

Here, in a case of using TMAH as an alkaline aqueous solution, the etching rate of polysilicon in the TMAH is larger than the etching rate of $SiO_2$. Therefore, as illustrated in (b) in FIG. 6, the etching is not much progressed on the $SiO_2$ film, but the etching is progressed more on the exposed polysilicon layer. That is, in the reference example 1, since the etching is progressed more on the peripheral portion of the wafer W than the center portion of the wafer W, it is difficult to improve the in-plane uniformity of the etching amount.

Figure 7:
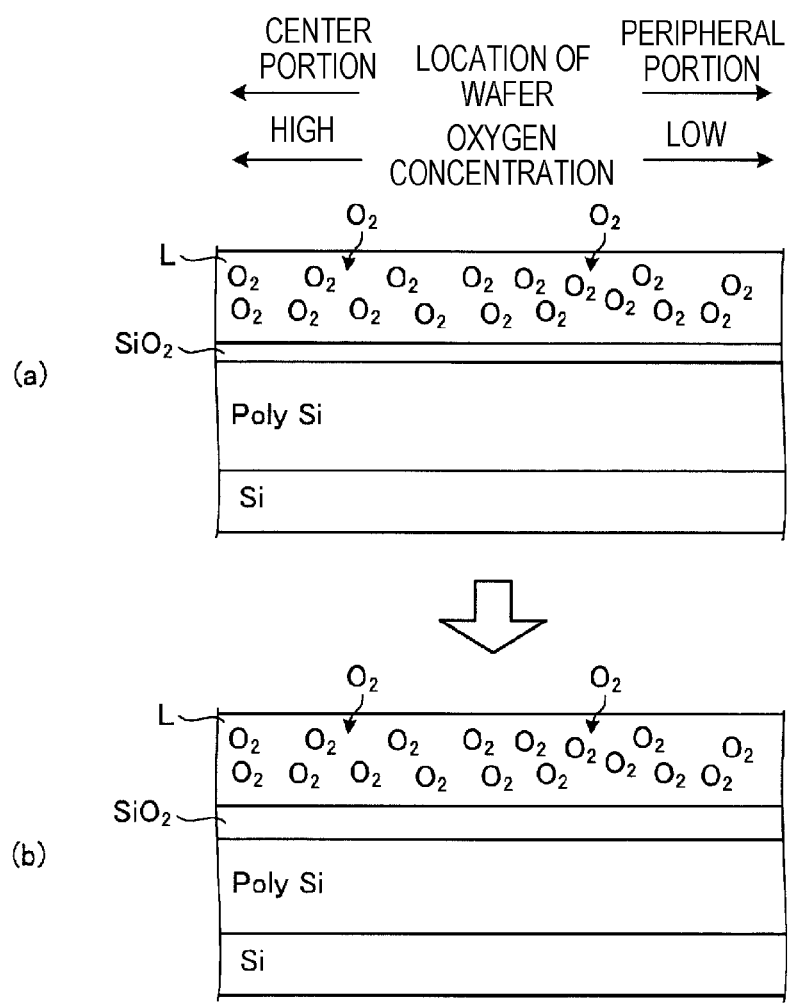
FIG. 7 is a diagram for explaining a surface state of a wafer according to an exemplary embodiment.

FIG. 7 is a diagram for explaining a surface state of a wafer W according to an exemplary embodiment. FIG. 7 is a diagram illustrating a case where, for example, the circulation temperature of the alkaline aqueous solution L is a predetermined temperature lower than the room temperature, and the amount of dissolved oxygen in the alkaline aqueous solution L is sufficient.

Similarly to the reference example 1, in the exemplary embodiment, when the alkaline aqueous solution L spreads from the center portion of the wafer W toward the peripheral portion thereof, oxygen in the solution reacts with the polysilicon layer on the surface of the wafer W so as to form a SiO2 film, and the oxygen concentration gradually decreases. However, in the exemplary embodiment, since the amount of the dissolved oxygen in the alkaline aqueous solution L is sufficient, the oxygen in the solution is not depleted even on the peripheral portion of the wafer W.

As a result, as illustrated in (a) in FIG. 7, a $SiO_2$ film is uniformly formed on the polysilicon layer over the entire area of the wafer W, and as illustrated in (b) in FIG. 7, the $SiO_2$ film is uniformly grown over the entire area of the wafer W. Therefore, in the exemplary embodiment, since the etching may be progressed uniformly from the center portion of the wafer W to the peripheral portion thereof, the in-plane uniformity of the etching amount may be improved.

<Processing Condition of Etching Processing>

Figure 8A:
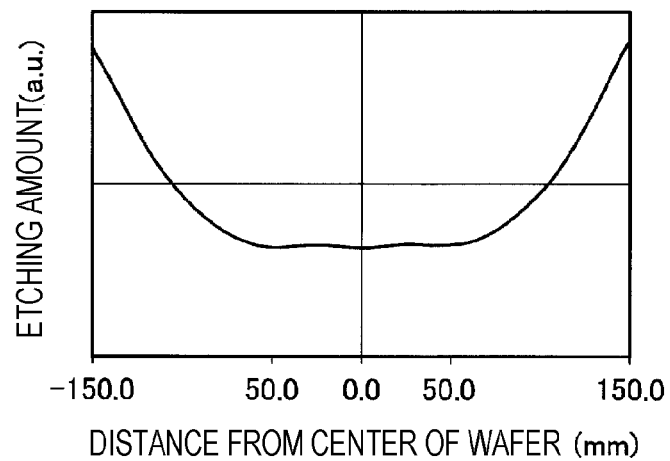
FIG. 8A is a diagram illustrating an in-plane distribution of an etching amount in a reference example 2.

Next, processing conditions of an etching processing in the exemplary embodiment will be described. FIG. 8A is a diagram illustrating an in-plane distribution of an etching amount in a reference example 2 and FIG. 8B is a diagram illustrating an in-plane distribution of an etching amount according to an exemplary embodiment.

Figure 8B:
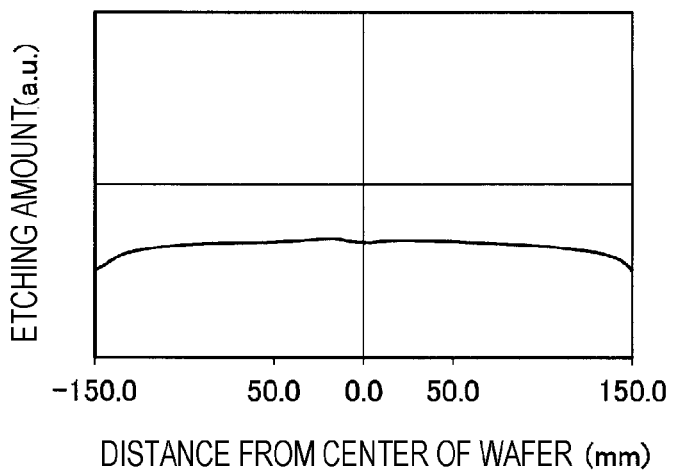
FIG. 8B is a diagram illustrating an in-plane distribution of an etching amount according to an exemplary embodiment.

Here, FIG. 8A illustrates an in-plane distribution when the etching processing is performed under the atmosphere which does not contain oxygen (here, under a nitrogen atmosphere), and FIG. 8B illustrates an in-plane distribution when the etching processing is performed under the atmosphere which contains oxygen (here, under the atmospheric condition). Further, the etching processing is performed using TMAH as an alkaline aqueous solution L in the same manner as described above.

As illustrated in FIGS. 8A and 8B, as compared with the case where the etching processing is performed under the atmosphere which does not contain oxygen, it is possible to improve the in-plane uniformity of the etching amount from the center portion of the wafer W to the peripheral portion thereof by performing the etching processing under the atmosphere which contains oxygen. This indicates that, as illustrated in (a) in FIG. 7, because the oxygen contained in the atmosphere is dissolved from the surface of the alkaline aqueous solution L, whereby oxygen is supplemented in the alkaline aqueous solution L, the depletion of oxygen in the solution on the peripheral portion of the wafer W is suppressed.

That is, according to the exemplary embodiment, it is possible to further improve the in-plane uniformity of the etching amount from the center portion of the wafer W to the peripheral portion thereof by performing the etching processing under the atmosphere which contains oxygen.

Figure 9:
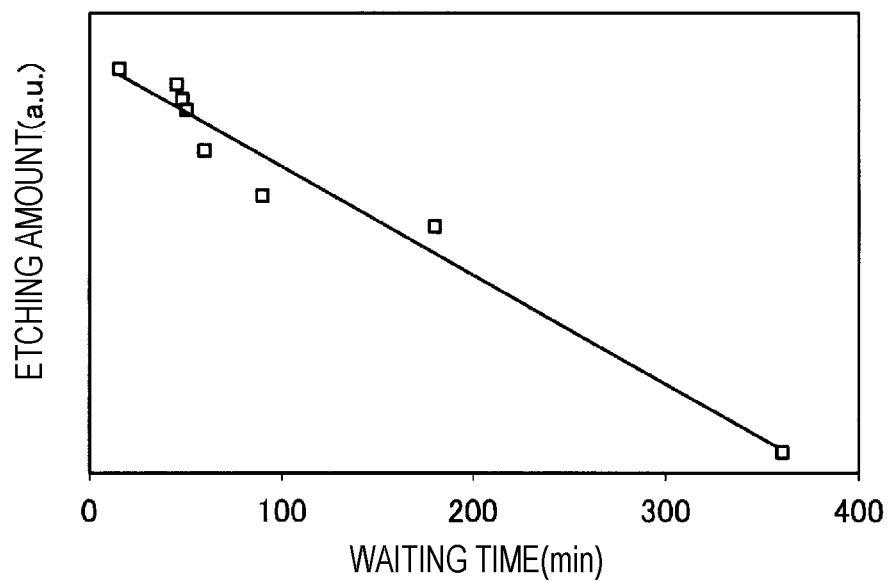
FIG. 9 is a diagram illustrating a relationship between a waiting time and an etching amount after an oxide film removing processing.

FIG. 9 is a diagram illustrating a relationship between a waiting time and an etching amount after an oxide film removing processing, and is an example in a case of using TMAH as an alkaline aqueous solution L. As described above, when TMAH is used as an alkaline aqueous solution L, since the etching rate of polysilicon is larger than the etching rate of $SiO_2$ in the case of using the TMAH, the influence of the natural oxide film formed on the surface of the polysilicon layer is not negligible.

Therefore, as illustrated in FIG. 9, the etching amount decreases as the waiting time until performing the etching processing by TMAH is prolonged, after performing the natural oxide film removing processing before the etching processing.

Figure 10:
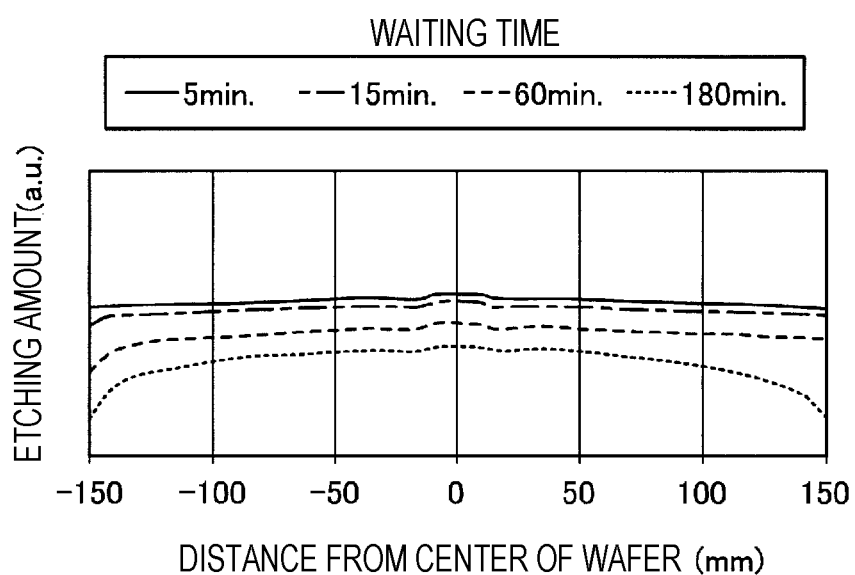
FIG. 10 is a diagram illustrating a relationship between a waiting time and an in-plane distribution of an etching amount after an oxide film removing processing.

FIG. 10 is a diagram illustrating a relationship between a waiting time and an in-plane distribution of an etching amount after an oxide film removing processing. Therefore, as illustrated in FIG. 10, the etching amount decreases as the waiting time until performing the etching processing by TMAH is prolonged, after performing the natural oxide film removing processing before the etching processing.

Therefore, according to the exemplary embodiment, in the processing unit 16 where the etching processing is performed, the natural oxide film removing processing may be performed before the etching processing. As a result, since the influence of the natural oxide film formed on the surface of the polysilicon layer is suppressed, the etching processing may be stably performed.

Further, according to the exemplary embodiment, in the processing unit 16, after performing the natural oxide film removing processing, the etching processing by TMAH may be performed within a preset time. As a result, since the influence of the natural oxide film is suppressed to the minimum, the etching processing by TMAH may be performed more stably.

In the exemplary embodiment, TMAH may be used as an alkaline aqueous solution L. By using TMAH, even when using an etching solution which is in a low temperature state by the low temperature dissolving processing as it is, it is possible to etch the polysilicon layer with a high etching rate.

Furthermore, in the exemplary embodiment, after the low temperature dissolving processing, the temperature raising processing for raising the temperature of the alkaline aqueous solution L may be performed before or simultaneously the etching processing. As a result, since the reaction rate constant of the etching reaction is able to be increased, the etching rate may be further increased.

The temperature raising processing according to the exemplary embodiment may be performed, for example, by raising the temperature of the supply line configured to supply an alkaline aqueous solution L, by raising the temperature of the in-line heater 80 provided in the supply line of the alkaline aqueous solution L. Further, the temperature raising processing according to the exemplary embodiment may be performed, for example, by raising the temperature of the wafer W supplying the alkaline aqueous solution L.

The temperature raising of the wafer F may be performed, for example, by ejecting the DIW heated by the heating unit 65a onto the back surface of the wafer W, or by ejecting the TMAH heated by the heating unit 65b onto the back surface of the wafer W. By using these methods, it is possible to perform the temperature raising processing of the alkaline aqueous solution L without greatly changing the configuration of the substrate processing system 1. Therefore, according to the exemplary embodiment, it is possible to perform the temperature raising processing of the alkaline aqueous solution L at low cost.

It is conceivable that the concentration of the dissolved oxygen in the solution decreases by raising the temperature of the alkaline aqueous solution L, but, in the supply line, since the surrounding of the alkaline aqueous solution L is covered with the supply line, the dissolved oxygen is not discharged to the outside. Further, since the etching is progressed before the dissolved oxygen is discharged to the outside on the wafer W, it is possible to suppress the influence of the decrease in the concentration of the dissolved oxygen in the solution to the minimum.

Further, the etching processing according to the exemplary embodiment may be performed in the state where the nozzle 41a configured to eject the alkaline aqueous solution L is fixed above the center of the wafer W, or by ejecting the alkaline aqueous solution L while moving the nozzle 41a by a predetermined operation.

In the exemplary embodiment, even when the etching processing is performed in the state where the nozzle 41a is fixed above the center of the wafer W, as illustrated in FIG. 4, it is possible to keep the in-plane uniformity of the etching amount from the center portion of the wafer W to the peripheral portion thereof good. Therefore, according to the exemplary embodiment, the recipe of the etching processing may be simplified by fixing the nozzle 41a above the center of the wafer W and performing the etching processing.

<Procedure of Substrate Processing>

Figure 11:
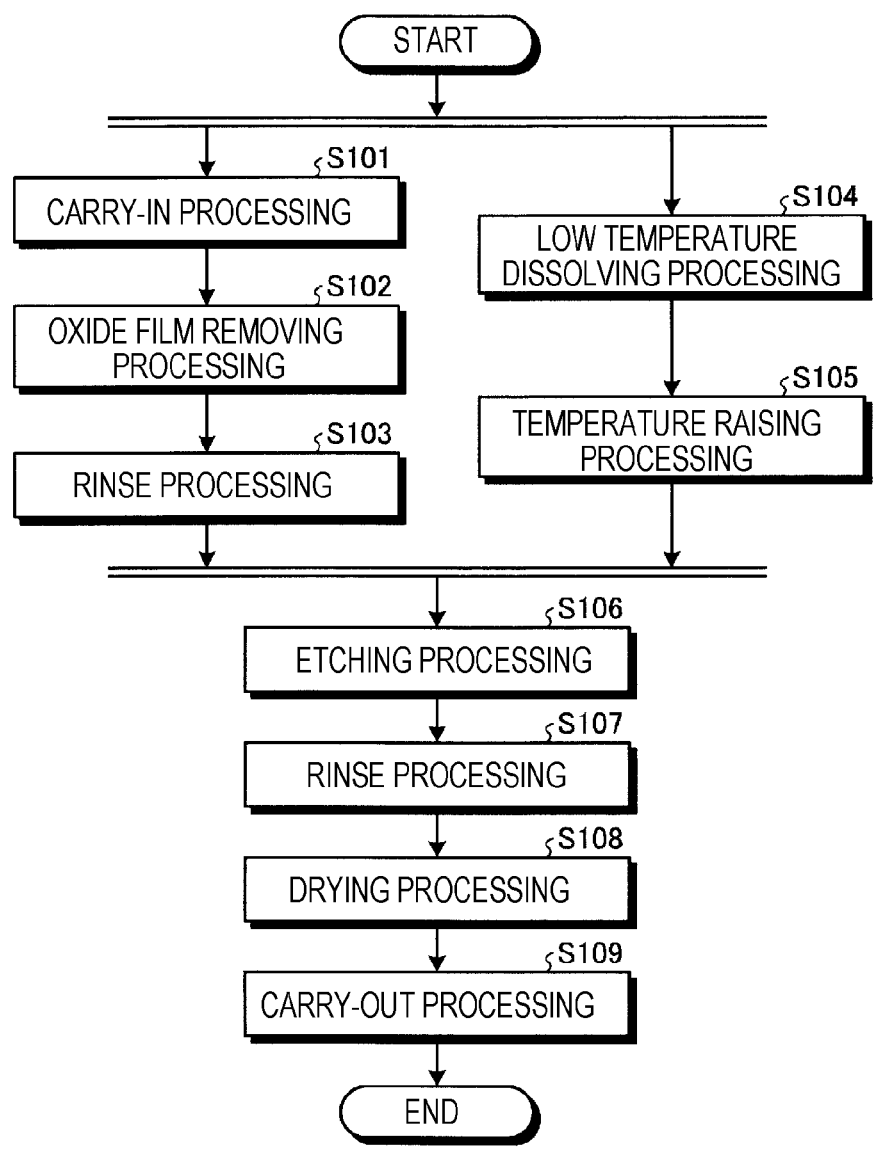
FIG. 11 is a flowchart illustrating a procedure of a substrate processing executed by a substrate processing system.

Next, the procedure of a substrate processing according to an exemplary embodiment will be described with reference to FIG. 11. FIG. 11 is a flowchart illustrating a procedure of a substrate processing executed by a substrate processing system 1.

As illustrated in FIG. 11, the processing unit 16 first performs a carry-in processing (step S101). In the carry-in processing, the control unit 18 controls the substrate transfer device 17 to carry the wafer W into the chamber 20 of the processing unit 16. The wafer W is held by the holding member 311 in a state where the surface to be etched faces upward. Thereafter, the control unit 18 controls the driving unit 33 to rotate the substrate holding unit 30 at a predetermined rotation speed.

Next, the processing unit 16 performs an oxide film removing processing (step S102). In the oxide film removing processing, the control unit 18 causes the nozzle 41c of the processing fluid supply unit 40 to be moved to above the center of the wafer W. Thereafter, the control unit 18 causes the valve 44c to be opened for a predetermined time to supply DHF which is an etching solution to the surface of the wafer W.

The DHF supplied to the surface of the wafer W is spread over the entire surface of the wafer W by the centrifugal force caused by the rotation of the wafer W. As a result, the natural oxide film formed on the polysilicon layer of the wafer W is removed. In the oxide film removing processing, for example, the natural oxide film formed on the polysilicon layer may be removed by about 20 (Å).

Next, the processing unit 16 performs a rinse processing (step S103). In the rinse processing, the control unit 18 causes the nozzle 41b of the fluid supply unit 40 to be moved to the above of the center of the wafer and causes the valve 44b to be opened for a predetermined time, to supply DIW to the surface of the wafer W.

The DIW supplied to the surface of the wafer W is spread over the entire surface of the wafer W by the centrifugal force caused by the rotation of the wafer W. As a result, the DHF remaining on the surface of the wafer W is substituted with the DIW.

In parallel with the processing of steps S101 to S103 described so far, the low temperature dissolving unit performs the low temperature dissolving processing (step S104). In the low temperature dissolving processing, the control unit 18 controls, for example, the temperature regulator 74 and the bubbling line 75 to dissolve oxygen in an alkaline aqueous solution L cooled to a predetermined temperature lower than the room temperature.

In such a low temperature dissolving processing, oxygen may be dissolved such that the dissolved oxygen in the alkaline aqueous solution L is saturated. As a result, since the depletion of oxygen in the solution on the peripheral edge of the wafer W is able to be suppressed, the in-plane uniformity of the etching amount may further be improved.

In such a low temperature dissolving processing, the substrate processing system 1 performs a temperature raising processing (step S105). In the temperature raising processing, for example, the controller 18 raises a temperature of the in-line heater 80 so that the temperature of the alkaline aqueous solution L ejected onto the wafer W through the supply line is raised. In this case, as illustrated in FIG. 11, the temperature raising processing is performed before the etching processing described later.

In addition, the temperature raising processing may be performed simultaneously with the etching processing described later. In this case, the control unit 18 may cause the valve 62a or 62b to be opened for a predetermined time to supply the heated DIW or TMAH to the back surface of the wafer W.

The processing unit 16 performs an etching processing (step S106). In the etching processing, the control unit 18 causes the nozzle 41a of the processing fluid supply unit 40 to be moved to above the center of the wafer W. Thereafter, the control unit 18 causes the valve 44a to be opened for a predetermined time to supply an alkaline aqueous solution L which is an etching solution to the surface of the wafer W.

The alkaline aqueous solution L supplied to the surface of the wafer W is spread over the entire surface of the wafer W by the centrifugal force caused by the rotation of the wafer W. As a result, the polysilicon layer of the wafer W is etched by the alkaline aqueous solution L.

Further, the etching processing according to the exemplary embodiment may be performed within a predetermined time after the processing of step S103, and also, under an atmosphere which contains oxygen.

Next, the processing unit 16 performs a rinse processing (step S107). In the rinse processing, the control unit 18 causes the nozzle 41b of the fluid supply unit 40 to be moved to the above of the center of the wafer and causes the valve 44b to be opened for a predetermined time, to supply DIW to the surface of the wafer W.

The DIW supplied to the surface of the wafer W is spread over the entire surface of the wafer W by the centrifugal force caused by the rotation of the wafer W. As a result, the alkaline aqueous solution remaining on the surface of the wafer W is substituted with the DIW.

Subsequently, the processing unit 16 performs a drying processing in which the wafer W is dried (step S108). In the drying processing, for example, the controller 18 controls the driving unit 33 to rotate the substrate holding mechanism 30 at a predetermined rotation speed, so that the wafer W held by the holding member 311 is spin-dried.

Further, the drying processing is not limited to the case where the DIW is directly spin-dried. For example, an IsoPropyl Alcohol (IPA) drying may be performed in which IPA is supplied to the surface of the wafer W by an IPA supply unit which is not illustrated, the DIW remaining on the surface of the wafer W is substituted with the IPA, and the IPA is spin-dried.

Thereafter, the processing unit 16 performs a carry-out processing (step S109). In the carry-out processing, the controller 18 controls the driving unit 33 to stop the rotation of the wafer W, and then controls the substrate transfer device 17 to carry the wafer W out from the processing unit 16. When the carry-out processing is completed, a series of substrate processings on one wafer W is completed.

In the above, although the exemplary embodiment of the present disclosure has been described, the present disclosure is not limited the above embodiment, and various modifications may be made without departing from the gist of the present disclosure. For example, in the exemplary embodiment, the example of low temperature dissolving processing which is performed by circulating the alkaline aqueous solution L by the circulating line 72 is described, but the low temperature dissolving processing may be performed without circulating the alkaline aqueous solution L.

Further, in the exemplary embodiment, as a temperature raising processing of the alkaline aqueous solution L, a processing of raising the temperature of the supply line configured to supply the alkaline aqueous solution L to the wafer W or a processing of raising the temperature of the wafer W to which the alkaline aqueous solution L is supplied, but both of two processings may be performed.

The substrate processing method according to the exemplary embodiment includes a low temperature dissolving processing (step S104) and an etching processing (step S106). In the low temperature dissolving processing (step S104), oxygen is dissolved in an alkaline aqueous solution L cooled to a predetermined temperature is lower than the room temperature. In the etching processing (step S106), the alkaline aqueous solution L in which oxygen is dissolved is supplied to the substrate (wafer W) to etch the substrate (wafer W). As a result, it is possible to improve an in-plane uniformity of an etching amount from the center portion of the wafer W to the peripheral portion thereof.

Further, the substrate processing method according to the exemplary embodiment, the alkaline aqueous solution L contains at least one of tetramethylammonium hydroxide (TMAH), choline aqueous solution, potassium hydroxide (KOH) aqueous solution, and aqueous ammonia. Therefore, the polysilicon layer on the wafer W may be etched.

Further, the substrate processing method according to the exemplary embodiment includes, before the etching processing (step S106), an oxide film removing processing (step S102) in which a natural oxide film formed on the surface of the substrate (wafer W) is removed. As a result, since the influence of the natural oxide film is able to be suppressed, the etching processing by TMAH may be performed stably.

Further, in the substrate processing method according to the exemplary embodiment, the etching processing (step S106) is performed within a preset time after the oxide film removing processing (step S102). As a result, since the influence of the natural oxide film is suppressed to the minimum, the etching processing by TMAH may be performed more stably.

Further, the substrate processing method according to the exemplary embodiment includes a temperature raising processing (step S105) for raising the temperature of the alkaline aqueous solution L, after the low temperature dissolving processing (step S104), and also before the etching processing (step S106) or simultaneously with the etching processing (step S106). As a result, the etching rate may further be increased.

Further, in the substrate processing method according to the exemplary embodiment, the temperature raising processing (step S105) includes at least one of a temperature raising processing of the supply line configured to supply the alkaline aqueous solution L to the substrate (wafer W) and a temperature raising processing of the substrate (wafer W) to which the alkaline aqueous solution L is supplied. As a result, it is possible to perform the temperature raising processing of the alkaline aqueous solution L at low cost.

Further, in the substrate processing method according to the exemplary embodiment, oxygen is dissolved such that the dissolved oxygen in the alkaline aqueous solution L is saturated in the low temperature dissolving processing (step S104). As a result, it is possible to improve an in-plane uniformity of an etching amount.

Further, in the substrate processing method according to the exemplary embodiment, the etching processing (step S106) is performed under an atmosphere which contains oxygen. As a result, it is possible to further improve an in-plane uniformity of an etching amount.

Further, the substrate processing apparatus according to the exemplary embodiment includes a low temperature dissolving unit 70 and a supply unit (the processing fluid supply unit 40). The low temperature dissolving unit 70 dissolves oxygen in an alkaline aqueous solution cooled to a predetermined temperature lower than the room temperature. The supply unit (the processing fluid supply unit 40) supplies the alkaline aqueous solution L in which oxygen is dissolved to the substrate (wafer W). The substrate (wafer W) is etched by supplying the alkaline aqueous solution L from the supply unit (the processing fluid supply unit 40) to the substrate (wafer W). As a result, it is possible to improve an in-plane uniformity of an etching amount from the center portion of the wafer W to the peripheral portion thereof.

Further, in the substrate processing apparatus according to the exemplary embodiment, a heater (in-line heater 80) is provided in the supply line of the alkaline aqueous solution L provided between the low temperature dissolving unit 70 and the supply unit (the processing fluid supply unit 40). As a result, the etching rate may further be increased.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
dissolving oxygen in an alkaline aqueous solution stored in a container with a bubbling line;
circulating the alkaline aqueous solution within the container through a circulation line;
cooling the alkaline aqueous solution in the circulation line to a predetermined temperature lower than a room temperature, and
etching a substrate by supplying the alkaline aqueous solution in which oxygen is dissolved to the substrate through a supply line connected to the circulation line.

2. The substrate processing method of claim 1, wherein the alkaline aqueous solution contains at least one of tetramethylammonium hydroxide (TMAH), choline aqueous solution, potassium hydroxide (KOH) aqueous solution, and aqueous ammonia.

3. The substrate processing method of claim 1, further comprising, before the etching, removing a natural oxide film formed on a surface of the substrate.

4. The substrate processing method of claim 3, wherein the etching is performed within a preset time after the oxide film removing.

5. The substrate processing method of claim 1, further comprising, after the dissolving and before or simultaneously with the etching, raising a temperature of the alkaline aqueous solution.

6. The substrate processing method of claim 5, wherein the temperature raising includes at least one of raising a temperature of the supply line and raising a temperature of the substrate to which the alkaline aqueous solution is supplied.

7. The substrate processing method of claim 1, wherein the dissolving dissolves oxygen such that the dissolved oxygen in the alkaline aqueous solution is saturated.

8. The substrate processing method of claim 1, wherein the etching is performed under an atmosphere which contains oxygen.

* * * * *